(12) United States Patent
Jacobsen et al.

(10) Patent No.: US 7,307,427 B2
(45) Date of Patent: Dec. 11, 2007

(54) METHOD AND APPARATUS FOR ENGINEERING A TESTABILITY INTERPOSER FOR TESTING SOCKETS AND CONNECTORS ON PRINTED CIRCUIT BOARDS

(75) Inventors: Chris R. Jacobsen, Ft. Collins, CO (US); Kenneth P. Parker, Ft. Collins, CO (US); Myron J. Schneider, Ft. Collins, CO (US); Tak Yee Kwan, Ontario (CA)

(73) Assignee: Agilent Technologies, Inc., Santa Clara, CA (US)

( * ) Notice: Subject to any disclaimer, the term of this patent is extended or adjusted under 35 U.S.C. 154(b) by 150 days.

(21) Appl. No.: 11/188,080

(22) Filed: Jul. 23, 2005

(65) Prior Publication Data

US 2007/0018672 A1    Jan. 25, 2007

(51) Int. Cl.
*G01R 31/08* (2006.01)
(52) U.S. Cl. .................................. 324/519; 324/158.1
(58) Field of Classification Search ................ 324/538, 324/638, 519, 158.1
See application file for complete search history.

(56) References Cited

U.S. PATENT DOCUMENTS

| | | | |
|---|---|---|---|
| 5,124,660 A | 6/1992 | Cilingiroglu | |
| 5,420,500 A | 5/1995 | Kerschner | |
| 5,498,964 A | 3/1996 | Kerschner et al. | |
| 5,557,209 A | 9/1996 | Crook et al. | |
| 6,703,851 B1* | 3/2004 | Howell | 324/754 |
| 6,960,917 B2 | 11/2005 | Parker et al. | |
| 6,961,231 B1* | 11/2005 | Alexander et al. | 361/321.2 |
| 7,068,039 B2 | 6/2006 | Parker | |
| 7,123,022 B2 | 10/2006 | Parker et al. | |
| 7,224,169 B2 | 5/2007 | Parker | |
| 2007/0001686 A1 | 1/2007 | Parker et al. | |

* cited by examiner

*Primary Examiner*—Walter Benson

(57) ABSTRACT

A method and apparatus is presented for gaining socket testability through the use of a capacitive interposer engineered to create capacitive coupling between signal nodes of a circuit assembly that the tester has access to and nodes of the socket that would not otherwise have any coupling to a testable signal node of the socket. Generally, coupling capacitance is engineered into the interposer by trace and via routing between the signal node of the socket and a location in close proximity to the inaccessible socket node such that their proximity to each other couples them together.

13 Claims, 12 Drawing Sheets

METHOD AND APPARATUS FOR ENGINEERING A TESTABILITY INTERPOSER FOR TESTING SOCKETS AND CONNECTORS ON PRINTED CIRCUIT BOARDS

BACKGROUND OF THE INVENTION

The present invention relates generally to integrated circuit assembly testing, and more particularly to a testability interposer for testing sockets and connectors on printed circuit boards.

Integrated circuit assemblies are ubiquitous in modern electronic devices, and a large portion of the industrial sector is devoted to the design and manufacture of such devices. As electronic devices are continually being improved and becoming more sophisticated, so are consumers' expectations for the level of quality of these products. Accordingly, new and improved testing techniques are continuously being sought by manufacturers to test the quality of integrated circuits, printed circuit boards, and integrated circuit assemblies after manufacture and prior to shipment of these devices. While testing entails checking many aspects of the product, such as functionality testing and burn-in testing, one of the most important tests after manufacture is basic continuity testing—that is, testing to ensure that all connections that are supposed to be connected between components of the device (e.g., integrated circuit pins to printed circuit boards, integrated circuit lead wires to pins, traces connections between printed circuit board nodes, etc.) are intact.

One common defect often uncovered during continuity testing is known as an "open" defect. In an open defect, an electrical connection is missing between two points in the circuit where electrical continuity should exist. Open defects typically result from problems in the manufacturing process, such as missing solder due to uneven application of solder paste, the unintentional introduction of particles in the wetting process, etc. Thus, during continuity testing of integrated circuit assemblies, connection defects such as open solder joints are diagnosed.

Detection of open defects is often performed using well-known capacitive lead-frame sensing technologies. For example, U.S. Pat. No. 5,557,209 to Crook et al, U.S. Pat. No. 5,420,500 to Kerschner, and U.S. Pat. No. 5,498,964 to Kerschner et al., all of which are hereby incorporated by reference for all that they teach, describe techniques for detecting opens between integrated circuit signal pins and the mounting substrate (typically a printed circuit board). FIG. 1A shows the basic setup and FIG. 1B shows the equivalent circuit model of capacitive lead-frame testing for open signal pins on an integrated circuit.

As shown, an integrated circuit (IC) die 18 is packaged in an IC package 12. The package 12 includes a lead frame 14 supporting a plurality of pins 10$a$, 10$b$. Pads of the IC die 18 are connected to the package pins 10$a$, 10$b$ at the lead frame 14 via bond wires 16$a$, 16$b$. The pins 10$a$, 10$b$ are supposed to be conductively attached, for example by way of solder joints, to pads 8$a$, 8$b$ of a printed circuit board (PCB) 6. The test setup shown in FIG. 1A determines whether package pins are properly connected to the PCB 6 at the solder joints. The test setup includes an alternating current (AC) source 2 that applies an AC signal, through a test probe 4$a$, to a node connected to the pad 8$a$ on the PCB 6 to which a pin under test 10$a$ should be electrically connected. In a typical test environment, the AC signal is typically 8192 Hz at 0.2 volts. A capacitive sensing probe 20 comprising a conductive sense plate 22 and amplifying buffer 24 is placed on top of the integrated circuit package 12. The capacitive sensing probe 20 is connected to a current measuring device 26, such as an ammeter. Another pin 10$b$ of the integrated circuit 12 is connected to a circuit ground via a grounded probe 4$b$.

When the test is performed, the AC signal applied to pad 8$a$ appears on the pin 10$a$ of the integrated circuit package 12. Through capacitive coupling, in particular a capacitance $C_{sense}$ formed between the lead frame 14 and sense plate 22, a current $I_s$ is passed to the sense plate 22 and then through the amplifying buffer 24 to the current measuring device 26. If the measured current $I_s$ falls between predetermined limits, then the pin 10$a$ is properly connected to the pad 8$a$. If the pin 10$a$ is not connected to the pad 8$a$, a capacitance $C_{open}$ is formed between the pad 8$a$ and pin 10$a$, altering the current $I_s$ measured by the current measuring device 26 such that the measured current $I_s$ falls outside the predetermined limits, thereby indicating that an open defect is present at the pin connection.

Capacitive probe testing has not traditionally been used to test fixed pins or tied pins because of the lack of diagnostic separability and presence of significant capacitance due to board-mounted bypass capacitors. A fixed pin is usually considered to be a power or ground pin because it cannot be moved easily with a test stimulus. A tied pin is considered to be any pin for which several other pins on the same device (such as an integrated circuit or connector) share the same node. Note that because devices such as integrated circuits and connectors typically provide multiple power and ground pins, the power and ground fixed pins may also be tied pins as well. For purposes of this patent, the terms "fixed" and "tied" will be used interchangeably because the differences in terms of the present invention are slight.

Recent patent applications U.S. patent application Ser. No. 10/703,944, entitled "Methods and Apparatus For Testing And Diagnosing Open Connections For Sockets And Connectors On Printed Circuit Boards" to Parker et al, and U.S. patent application Ser. No. 10/836,862, entitled "Methods and Apparatus For Non-Contact Testing And Diagnosing Open Connections For Connectors On Printed Circuit Boards" to Parker et al., each of which is incorporated by reference for all that it teaches, collectively describe a method for testing opens on fixed and/or tied pins on connectors and sockets by analyzing inherent capacitive structures present in the network. The '944 application extends the capacitive leadframe testing concept to allow the testing of sockets and connectors, especially when they contain large numbers of pins that are connected to ground and power planes, by introducing the concept of engineering capacitances on an appliance that is inserted into a socket to be tested. This appliance with the engineered capacitance structure contains a common node that is ohmically connected to the active signal buffer, which in turn is ohmically contacted by probes that are coupled to tester circuitry. The ability to test fixed nodes depends on the layout and whether the fixed node is adjacent to an accessible signal node.

In particular, this technology creates a "Matched Capacitor Array" ("MCA") device 30, shown in FIG. 2A, that fits into a socket connector 40 to be tested. The MCA device 30 includes a plurality of pins 31$a$-31$l$ that contact corresponding respective sockets 41$a$-41$l$ of the connector 40. The sockets 41$a$-41$l$ are supposed to be connected to pads 51$a$-51$l$ of a PCB via joints 52$a$-52$l$, represented also as balls A-L, and it is typically the integrity of these joints 52$a$-52$l$ that is being tested. Each pin 31$a$-31$l$ has a tiny, engineered capacitance (C) 33$a$-33$l$ to a common sense plate 34 (surrounded by a Faraday shield 35) that is then fed to a current measuring device 54 (FIG. 2B). The signal pins 33$a$, 32c, 32e, 32g, 32i, 32k are paired by an engineered pairing capacitance 32a, 32b, 32c, 32d, 32e, 32f to a neighboring power or ground pin 33b, 32d, 32f, 32h, 32j, 32l as shown in FIG. 2A.

The equivalent circuit for this configuration is shown for a capacitively coupled pair of pins 31a and 31b in FIG. 2B. In the illustrative example, the pair-coupling capacitance 32a has been set to 10*C. An AC source generator 52 applies an AC signal to the node 51a on the board to which the socket 41a should be connected. Current transferred to the common sense plate 34 of the MCA 30 is sensed by capacitive sensing probe 36 (FIG. 2A), which grounds the shield 35 via ground channel 37a, 37b. Sensed current on the common sense plate 34 is transferred to the current measuring device 54 over signal channel 38a, 38b. The input to the current measuring device 54 is a virtual ground. The sensed current is proportional to capacitance.

When no opens are present, the signal from signal generator 52 enters joint 52a (ball A). (Note the source impedance is small.) A voltage is developed at joint 52a (ball A). Joint 52b (ball B) is grounded, so the potential across joint 52b (ball B) is zero volts. Thus no current can flow from joint 52b (ball B) to the current meter 54. The value of capacitance measured is C.

If only joint 52a (ball A) is open, no signal will make it to the current meter 54, so the value measured is zero volts.

If only joint 52b (ball B) is open, the grounding of joint 52b (ball B) is prevented. Because the pair-coupling capacitor is much larger (10×) than C, the effective capacitive coupling to the current meter 54 is almost equal to C, resulting in an effective capacitance at the meter of approximately 2*C.

If both joints 52a and 52b (balls A and B) are open, the open on joint 52a (ball A) dominates the result, for a measurement of zero volts. TABLE 1 summarizes the measurement results:

TABLE 1

| Defect | Measured capacitance |
| --- | --- |
| None | C |
| Ball A open | 0 |
| Ball B open | 2 * C |
| Ball A and B open | 0 |

In this example, the capacitance measurements are differentiated by at least a value of C. As long as the current meter 54 is sensitive over a range of 0 to 2*C, open defects are detectable and can be diagnosed.

U.S. patent application Ser. No. 10/836,862 evolves this idea by recognizing that the traditional capacitive lead-frame sense plate along with the inherent capacitances of the socket device under test are sufficient to obtain the same diagnostic coverage of the pins without having to insert an appliance into the socket. The technique of '862 describes testing the socket fixed pins implicitly by analyzing inherent capacitive structures (i.e., nearby pins) present in the network.

The above concepts have been extended not only to include fixed open pins but also to inaccessible shorted or open pins in U.S. patent application Ser. No. 11/170,365, entitled "Methods And Apparatus For Non-Contact Testing And Diagnosing Of Open Connections On Non-Probed Nodes" to Parker et al., and in U.S. patent application Ser. No. 10/979,590, entitled "Methods And Apparatus For Non-Contact Testing And Diagnosing Of Inaccessible Shorted Connections" to Parker, both of which are herein incorporated by reference for all that they teach. Inaccessible pins are considered to be nodes for which the tester either does not have probe access to or are purposely selected for non-probing, and therefore cannot be stimulated with an AC source by the tester.

U.S. patent application Ser. No. 10/834,449, entitled "Test Structure Embedded In A Shipping And Handling Cover For Integrated Circuit Sockets And Method For Testing Integrated Circuit Sockets And Circuit Assemblies Utilizing Same" to Parker leverages these ideas for the case where the socket includes a lid or clamping structure that prevents the sense plate from coupling to the pins in the socket. Such sockets are typically mounted on PCBs and used to allow a mating integrated circuit to be added or replaced after the board is manufactured. An exemplary IC mounted to a board via a socket connector is illustrated in FIG. 3, in which an IC 60 is secured in a socket base 70 by means of a lid or clamp plate 72 and a clamp or lock 76. The IC 60 is clamped or locked into place within the socket 70 by a clamp plate 72, which depresses the IC 60 onto a field of contact pin spring fingers 78 that map one-to-one to solder balls (or pins) 66 on the bottom of the socket 70. The IC 60 may make electrical contact with a board 68 via hundreds or thousands of delicate pin spring fingers 78, which map to an array of pads, pins, solder balls or solder columns 66 that are attached to traces, pads or other contact points on the board 68.

As seen in the cross-sectional side view of FIG. 4A and top view of FIG. 4B, which shows an empty, unlocked IC socket 70, the socket lid or clamp plate 72 may have a window or access hole 75 to permit a detachable heat sink 62 (FIG. 3) to be attached to the IC 60 after it is secured within the socket base 70. The heat sink 62 may be connected to the IC 60 through the access hole 75 in the clamp plate 72. If an installed IC 60 must later be removed, the heat sink 62 is removed first to enable movement of the clamp plate 72. The clamp plate 72 may be hinged on one side with a hinge 74 and clamped on one or more sides with one or more clamps 76 or it may be clamped on two or more sides.

FIG. 5A illustrates a socket cover described in U.S. patent application Ser. No. 10/834,449, and FIGS. 5B and 5C illustrate the socket cover of FIG. 5A positioned in the socket of FIGS. 4A and 4B. In particular, a conductive plane 84 is embedded into a shipping and handling cover 80 for a socket 70 of a circuit assembly to facilitate capacitive sense testing of the socket connections. The conductive plane 84 of the shipping and handling cover 80 allows capacitive sense testing of socket pin connections 66 that would otherwise be testable using the techniques of the above-mentioned U.S. patent application. The shipping and handling cover 80 may also include a handle 82 for facilitating insertion and removal of the cover 80 and minimizing damage to the socket contacts.

It has been established that fixed and inaccessible pins on sockets can be tested whenever the pin layout is advantageous, meaning that some amount of coupling exists between an accessible signal pin and the fixed or inaccessible pin that is to be tested. There are some pin layouts, however, that have regions of nodes (e.g., pins) without any coupling capacitance (or at least, in terms of a capacitive sense test to be performed, sufficient amounts of coupling capacitance) to nearby signal nodes. This results in loss of coverage for the existing solutions that are based on capacitive sensing.

Industry has tried to regain some of this coverage through the use of silicon chip based technologies that are inserted into the socket and may include active components such as field effect transistors (FETs). A big drawback of a solution with active components is the need to provide power to the test and thus for the printed circuit board (PCB). Powering the PCB for the socket test requires tri-stating of all other active PCB components that are connected to the socket. Another drawback is the time and cost associated with doing the design and masks for the test chip. Much of these costs are then repeated whenever the pin functionality of the socket changes.

Accordingly, a need exists for a less costly testing solution for detecting open connections on nodes of sockets and connectors regardless of the pin layout.

SUMMARY OF THE INVENTION

The present invention is a method and apparatus for gaining socket and connector testability through the use of capacitive interposer designed to operate with a capacitive sense plate. The interposer operates to create coupling between signal nodes that the tester has access to and nodes that would not otherwise have any coupling to a testable signal node of the socket/connector. Generally, coupling capacitance is engineered into the interposer by routing the signal and fixed pin such that their proximity to each other couples them together.

The interposer may be formed with a sensor extender to facilitate accessibility by a capacitive sensing probe. The interposer may also be formed into a shipping and handling socket cover (or slug) to provide dual functionality of protection and testability.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

As used herein, the term "node" refers to the conductive portion of an electrical device that forms a single electrical point in the equivalent schematic diagram of the electrical device. For example, a node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof.

The present invention will be described in detail with reference to illustrative embodiments wherein the device under test is a socket or connector. As used herein, the terms "socket" and "connector" will be considered one and the same since they both are components that accept either a silicon chip or mating PCB and both have electrical contact mechanisms such as pins or springs.

The present invention will now be described for a socket that accepts a silicon chip. Such sockets are mounted on PCBs and used to allow a mating integrated circuit to be added or replaced after the board is manufactured.

Figure 10:
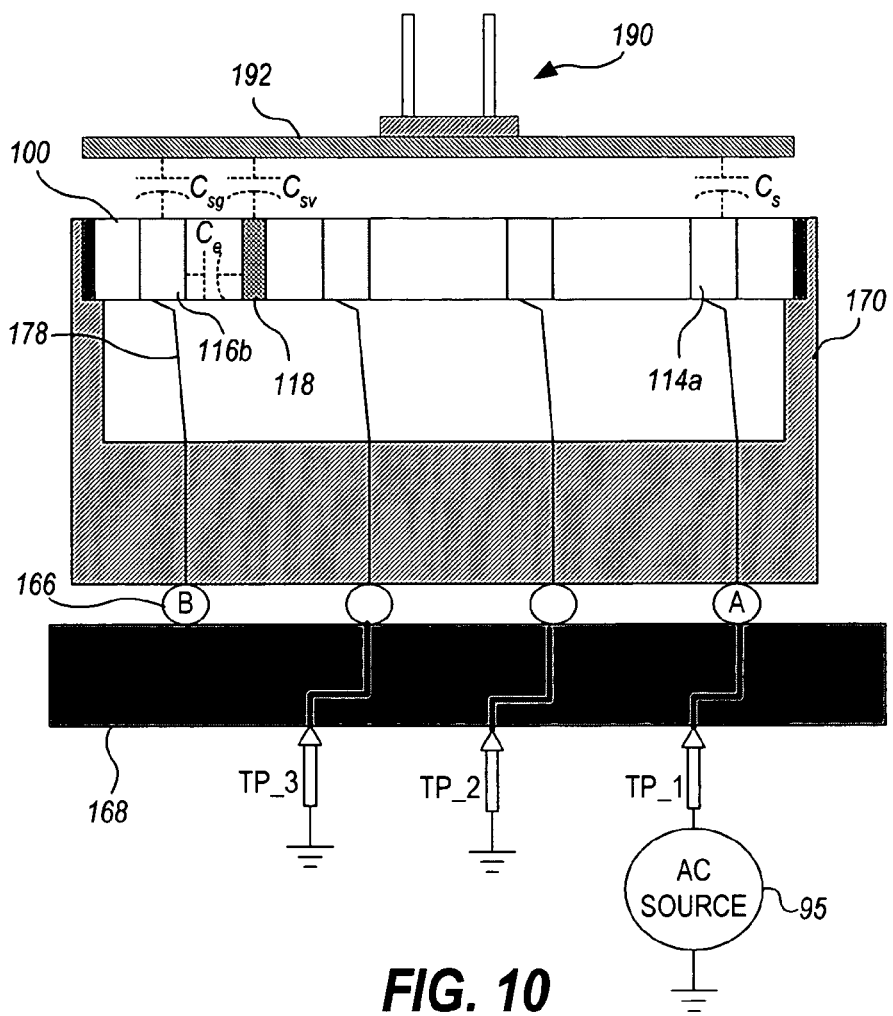
FIG. 10 is a side, cut-away view of an exemplary embodiment of a testability interposer for enabling testing continuity of electrical paths through a socket connector of a circuit assembly mated with a socket, with a capacitive lead-frame test assembly coupled to the testability interposer.

The present invention involves the use of a testability interposer 100 that fits into an integrated circuit socket or connector such as the IC socket 170 of FIG. 10. The interposer provides coupling between signal pins on the socket 170 that are supposed to be connected to nodes on the PCB that the tester has access to and the fixed pins that would not have any coupling to a testable signal node. Coupling capacitance is engineered into the interposer by routing the signal and fixed pins such that their proximity to each other couples them together.

Figure 6A:
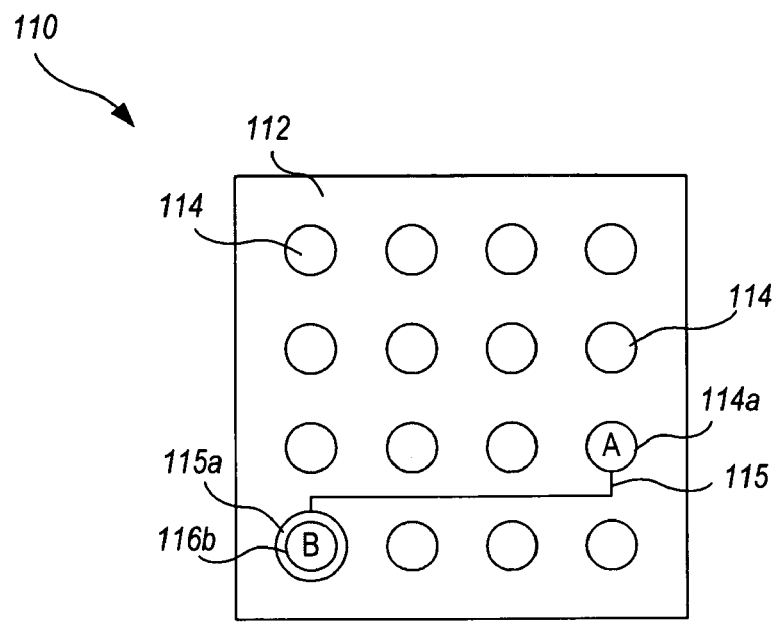
FIG. 6A is a top-down view of a layout design of an exemplary interposer.
Figure 6B:
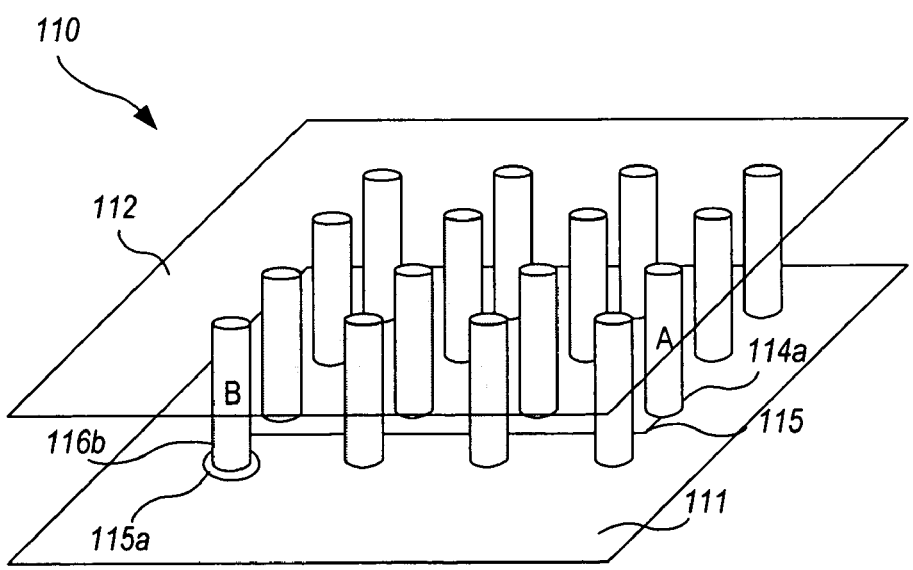
FIG. 6B is a perspective view of the layout design of an exemplary interposer of FIG. 6A.

FIGS. 6A and 6B illustrate a first example embodiment of a capacitive interposer 110 for a socket connector. FIG. 6A is a top-down view, and FIG. 6B is a perspective view, of an example interposer 110. The interposer 110 comprises a first interface layer 111 that operates as the interface layer to the contacts in the socket. All socket contacts are translated to the top layer with vias and pads. Sense plate capacitance $C_s$ (see FIG. 10) is formed between the sense plate 192 residing just above the interposer 110 and the top layer 112 of the interposer 110. The shaded contact pads 116 (such as pad 116b, labeled B) represent connections to fixed or inaccessible nodes in the socket 170, whereas the non-shaded contact pads (such as the pad 114a, labeled A) represent connections to tester-accessible signal nodes.

Figure 7A:
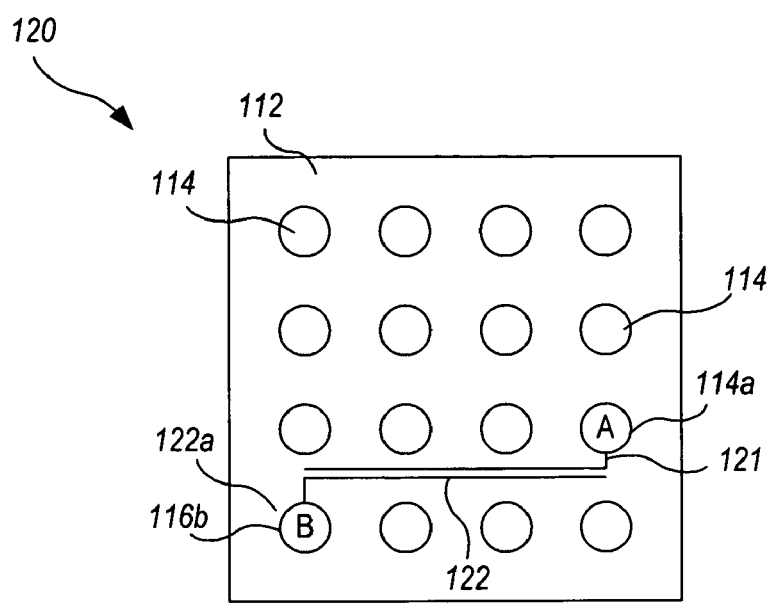
FIG. 7A is a top-down view of a different layout design of an exemplary interposer.
Figure 8A:
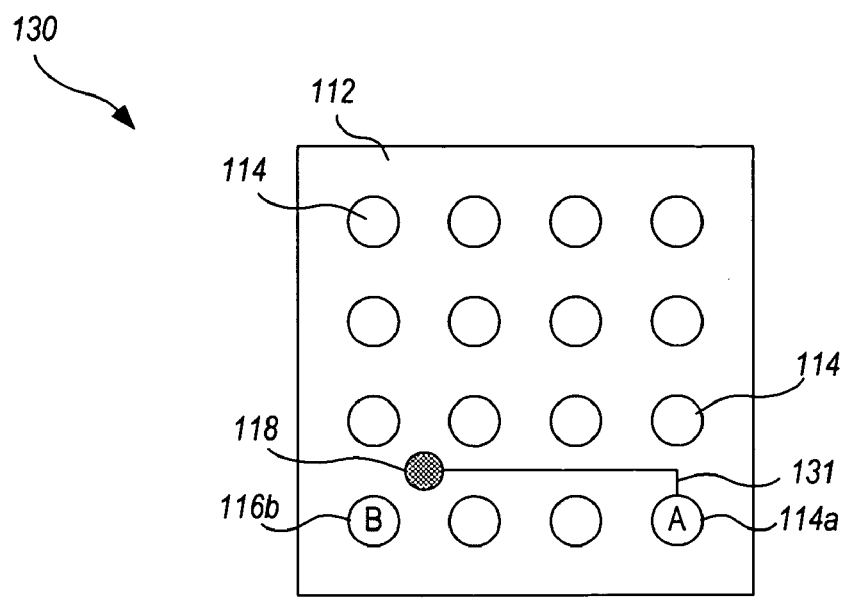
FIG. 8A is a top-down view of a different layout design of an exemplary interposer.

As can be seen in the layout designs of FIGS. 6A, 7A, and 8A, the fixed pins are not interspersed among the signal pins and thus some such as pin B would not have any natural coupling to a signal pin. The interposer design in FIGS. 6A and 6B shows how coupling is created between signal pin A and fixed pin B through a trace ring design formed by trace 115 connected at contact 114a routed to a trace ring 115a surrounding contact 116b. The exact value of capacitance between the trace ring 115a and contact 116b is dependent upon the spacing between the trace ring 115a and the contact 116b.

Figure 7B:
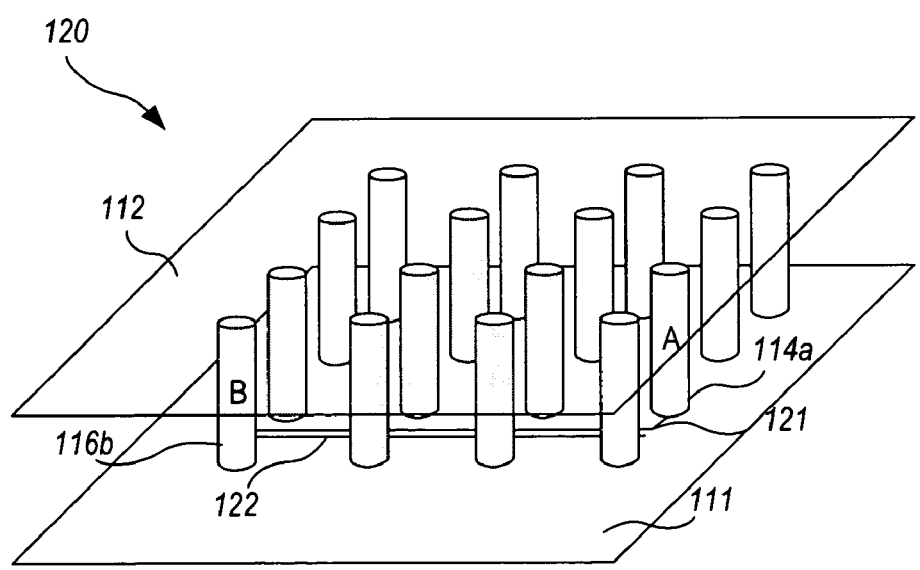
FIG. 7B is a perspective view of the layout design of an exemplary interposer of FIG. 7A.

FIGS. 7A and 7B show a layout design similar to that of FIGS. 6A and 6B, except that the trace 121 connected to contact pad 114a couples to a nearby second trace 122 connected to contact pad 116b.

Figure 8B:
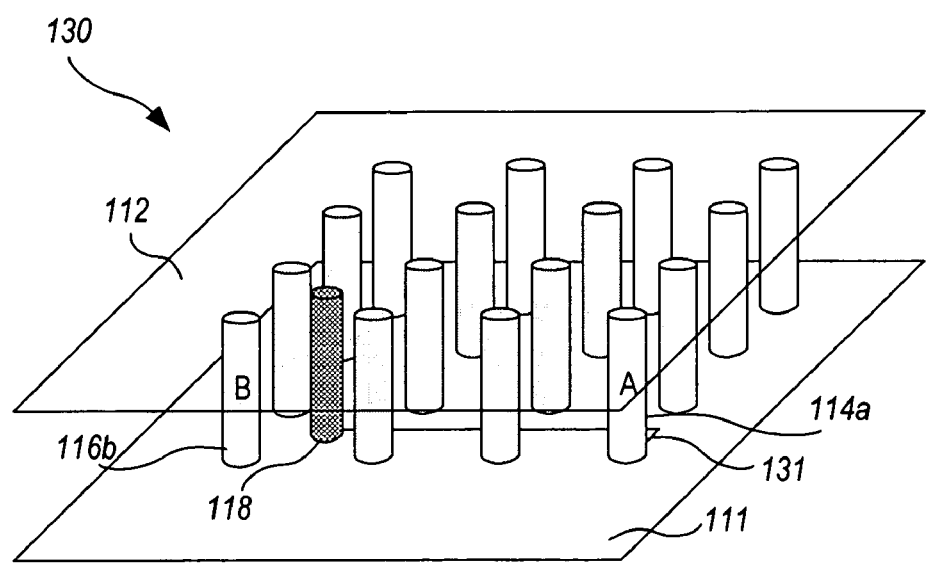
FIG. 8B is a perspective view of the layout design of an exemplary interposer of FIG. 8A.

Unlike the designs of FIGS. 6A, 6B and 7A, 7B where the contact A to contact B coupling occurs entirely on the socket interface layer 111 of the interposer PCB, the design layout shown in FIGS. 8A and 8B relies on capacitive coupling between vias that span the thickness of the interposer PCB. Contact A in FIGS. 8A and 8B has a trace 131 on the socket interface layer 111 that connects to a via 118 placed in close proximity to the via 116b associated with fixed contact pad B.

It will be appreciated that the design layouts of FIGS. 6A, 6B, 7A, 7B, 8A, and 8B depict only simple cases of a single signal coupling with a single fixed pin. In practice, the routing will be more complex due to the need to couple each fixed pin with at least one signal pin. In most cases, this will be beneficial to the test software because of additional diagnostic resolution to indicate opens.

Figure 9A:
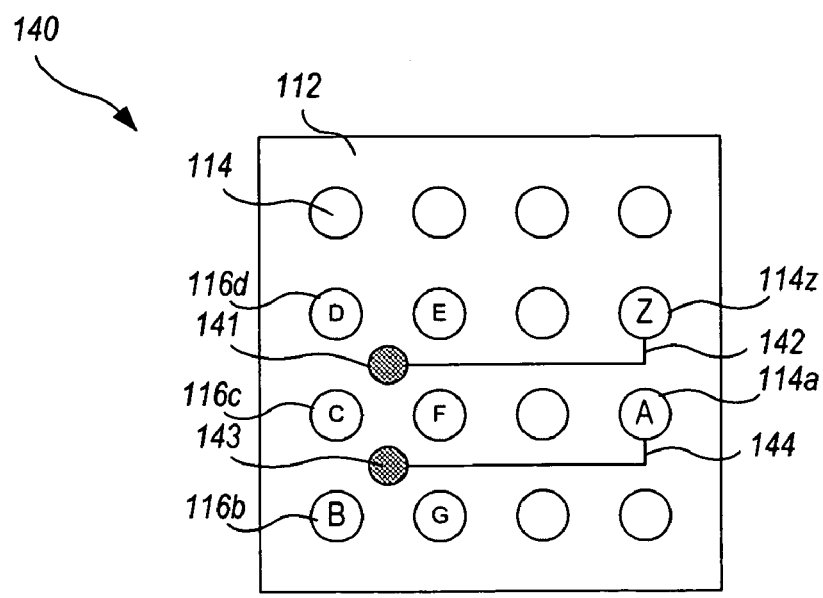
FIG. 9A is a top-down view of a different layout design of an exemplary interposer.
Figure 9B:
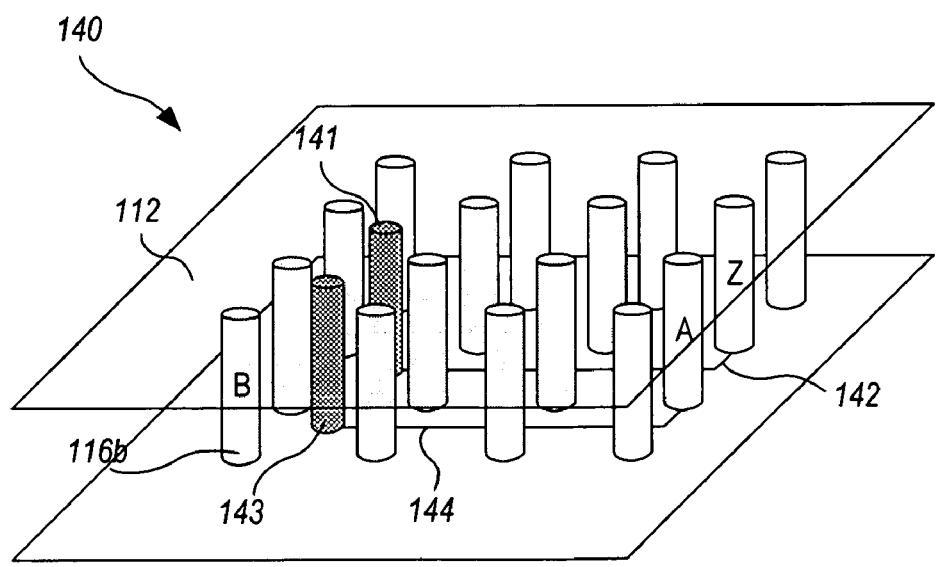
FIG. 9B is a perspective view of the layout design of an exemplary interposer of FIG. 9A.

FIGS. 9A and 9B illustrate an example layout with multiple couplings. The design of FIG. 9A and 9B shows an additional trace 142 and via 141 routed from a signal contact pad 114z, labeled Z. Signal pad 114a is connected by a trace 144 to via 143. Via 143 couples to fixed pads labeled B, C, F, and G. Signal pad 114z is connected by a trace 142 to via 141. Via 141 couples to fixed pads labeled C, D, E, and F. An open defect on fixed pin C or F will cause elevated capacitance readings for both signal pads A and Z. Open defects on nodes at contacts D, E, B, or G will not result in elevated readings on signals A and Z simultaneously. This concept can be extended to develop more complex routing schemes to achieve even better diagnostic resolution.

Figures 1A, 1B:
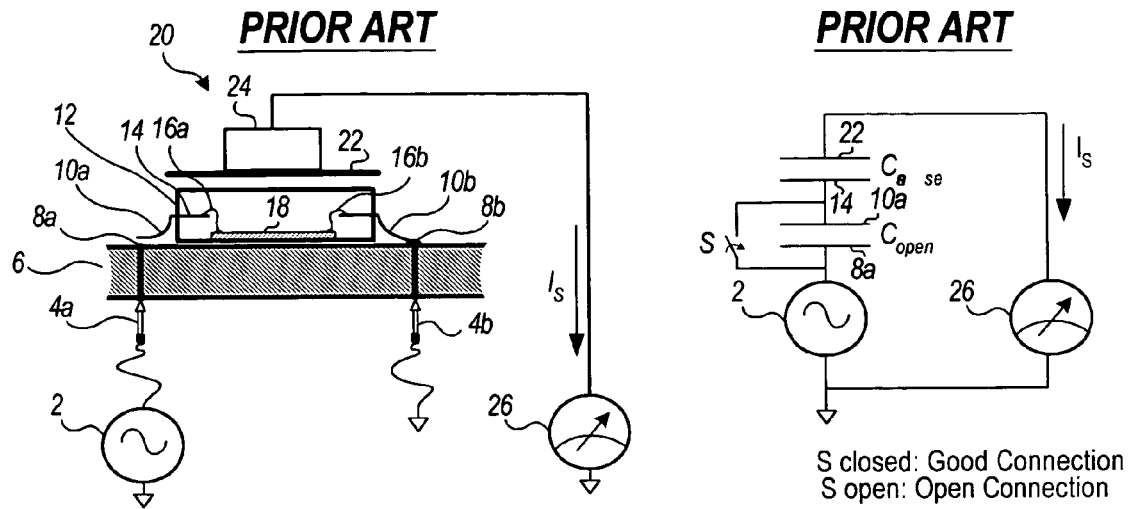
FIG. 1A is a schematic block diagram of a prior art capacitive lead-frame testing technique for diagnosing open signal pins on an integrated circuit.
FIG. 1B is a schematic diagram of the equivalent circuit model of the test setup of FIG. 1A.
Figure 2A:
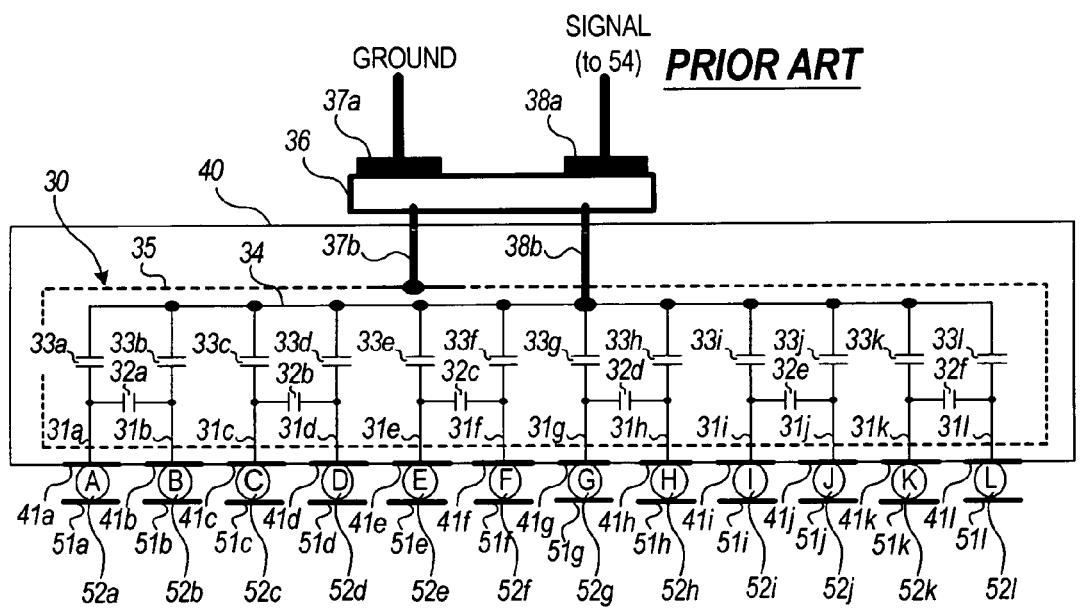
FIG. 2A is a schematic block diagram of a test setup of a prior art matched capacitor array testing technique for diagnosing non-contacted open signal pins on an electrical connector.
Figure 2B:
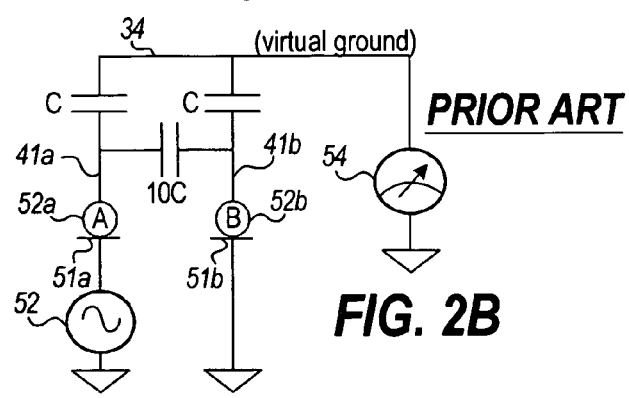
FIG. 2B is a schematic diagram of the equivalent circuit model of the test setup of FIG. 2A.
Figure 3:
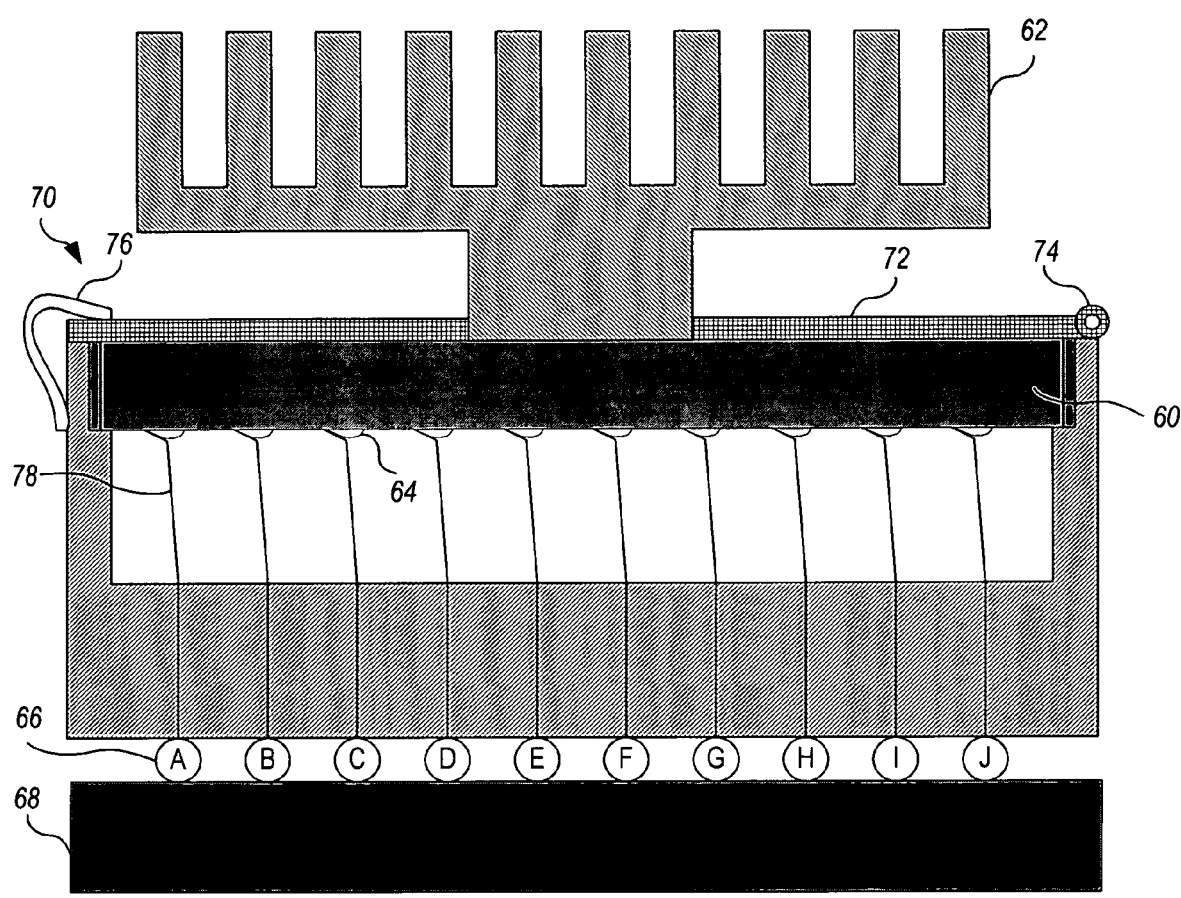
FIG. 3 is a side, cut-away view of an exemplary integrated circuit socket with an integrated circuit housed therein.
Figure 4A:
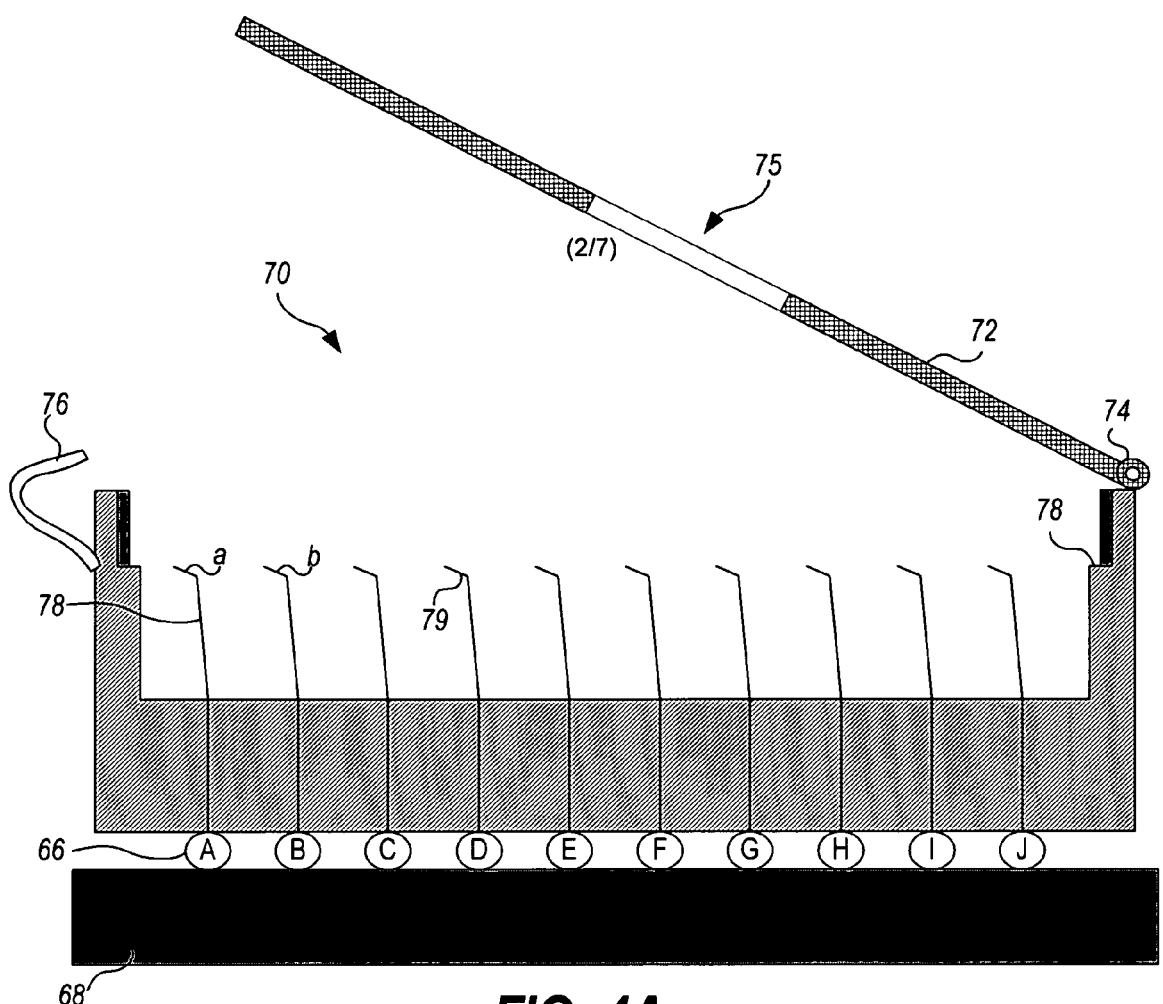
FIG. 4A is a side, cutaway view of an unlocked, empty integrated circuit socket mounted on a circuit assembly.
Figure 4B:
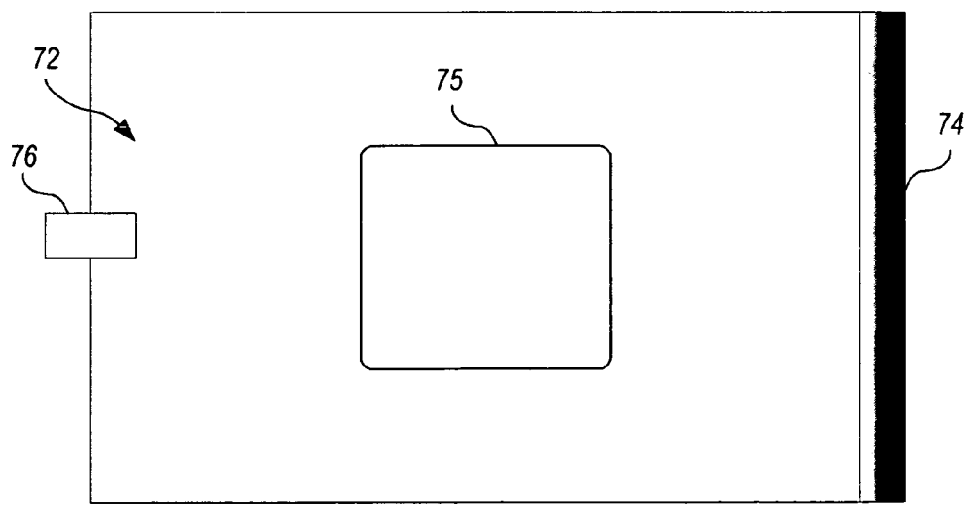
FIG. 4B is a top view of an exemplary integrated circuit socket.
Figure 5A:
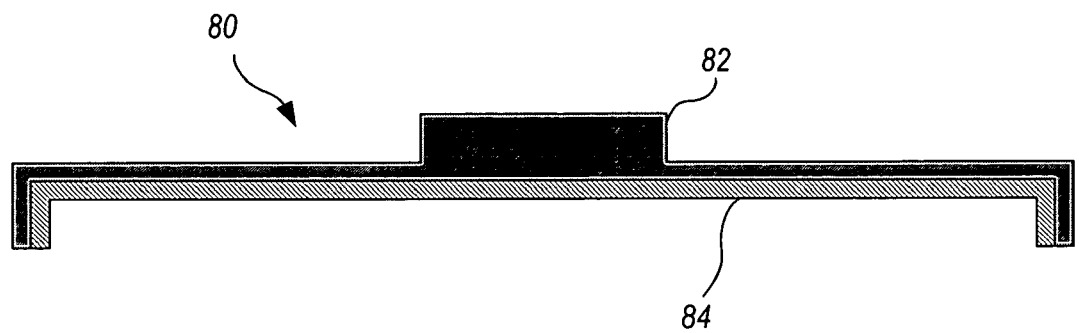
FIG. 5A is a side, cut-away view of an exemplary integrated circuit socket cover.
Figure 5B:
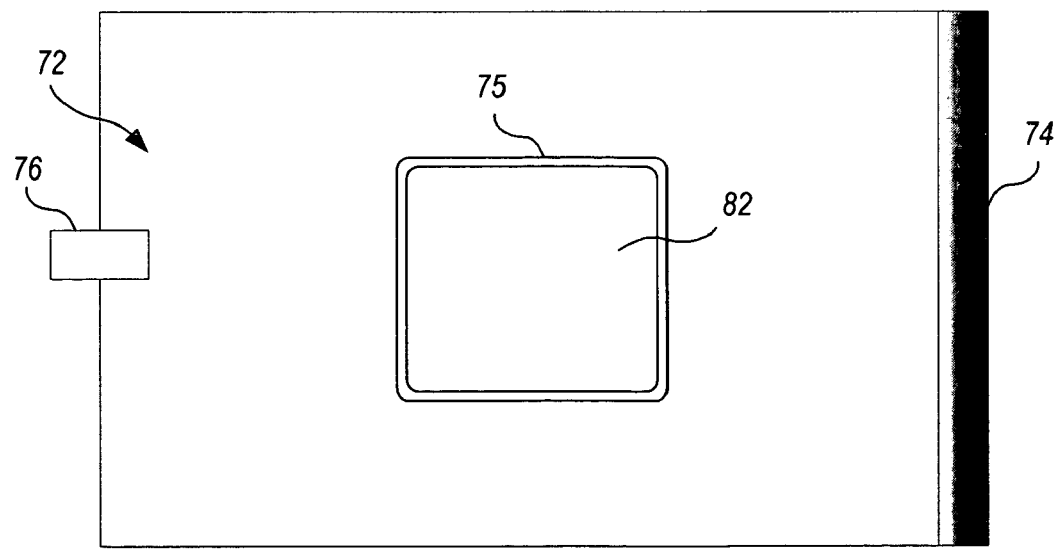
FIG. 5B is a top view of an exemplary integrated circuit socket with the exemplary integrated circuit socket cover of FIG. 5A housed therein.
Figure 5C:
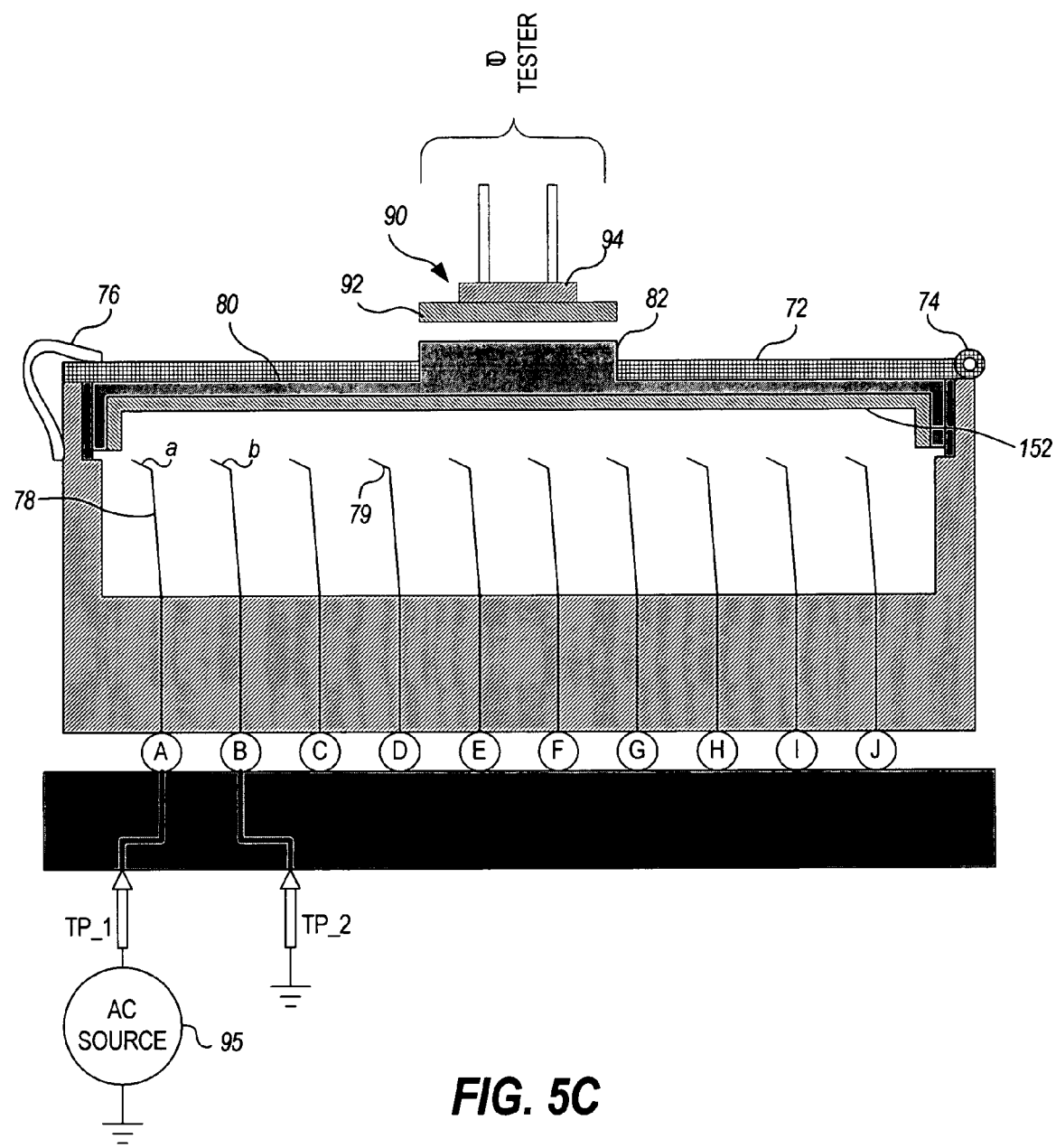
FIG. 5C is a side, cutaway view of an exemplary integrated circuit socket with the exemplary integrated circuit socket cover of FIG. 5A housed therein.
Figure 11:
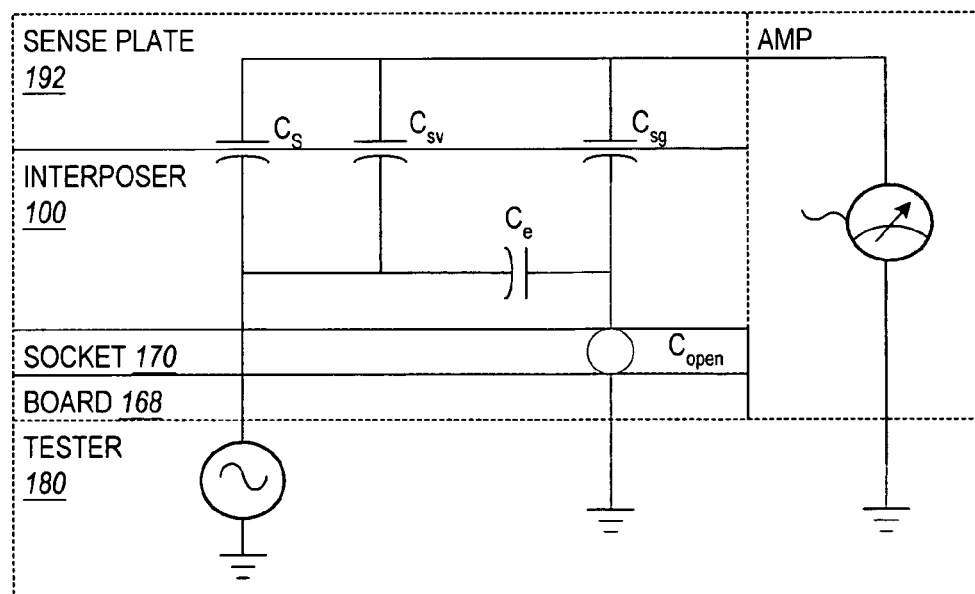
FIG. 11 is an equivalent schematic diagram of the circuit of FIG. 10.

FIG. 10 illustrates how an interposer 100 fits inside of a socket 170 and under a sense plate 192 of a capacitive sensing probe 190. The capacitances illustrated are the relevant associated capacitances for the layout design of the interposer 130 of FIGS. 8A and 8B. These capacitances correspond to the schematic shown in FIG. 11. Note that the capacitance $C_s$ connects to the signal pad labeled A in FIGS. 8A, 8B. Capacitances $C_{sg}$, $C_{sv}$, and $C_s$ are the sense capacitances between the interposer 100 and the sense plate 192 for the grounded pad B 116b, via 118, and signal pad 114a, respectively. Capacitance $C_e$ is the capacitance that has been engineered by locating the via 118 close to the via labeled B that is connected to ground pad 116b. Additionally, FIG. 11 shows the open capacitance $C_{open}$ that would be present for defects such as missing or malformed socket solder ball, bent socket mating contact, etc. Comparing the schematic representations of FIGS. 2B and 11 reveals no major topology differences. Combining capacitances $C_s$ and $C_{sv}$ will make the topologies and thus the circuit theory from previous patent applications fundamentally identical.

The example interposer designs discussed herein represent only a few methods for introducing engineered coupling capacitance, but it is understood that other readily available techniques for engineering coupling capacitance on a PCB are possible. It is to be understood that the invention extends to any technique for engineering coupling capacitances between nodes of an interposer that is matable with a socket or connector.

It is also to be understood that while the present discussion has been in the context of detecting open defects at the solder joints connecting the socket to the PCB, the testability interposer technique of the invention may be readily applied to detecting short defects as well based on the capacitive relationships discussed in the previously discussed related patent applications.

The testability interposer of the present invention may further include a handle 156 (FIG. 12) to allow the interposer 150 the dual function of testability and as a shipping/handling slug. Consider a sensor extender which is merely a conductive plane without engineered capacitances used to extend the reach of the traditional capacitive sense plate into the socket. The introduction of a handle on the top of the sensor extender reduces damage to the socket pins during insertion into and removal from the socket under test while at the same time acting as an electrical extension of the sensor plate from inside the socket to provide easy access to a standard capacitive sensor plate. A variation of this includes direct electrical connection to the sensor amplifier using multiple spring-loaded contacts which help reduce contact problems during production test.

One of the issues with existing socket test solution for LGA sockets is potential damage to socket pins during insertion and extraction of the test chip. The shape of the handle is designed to allow for reasonable size (height) for easy handling while allowing it to fit nicely within the hole in the top lid of the socket. It can be made simply of sheet metal cut or shaped and soldered to the solder pads on the top of the sensor extender.

Other variations of the design of the handle using non-conducting material are possible as long as the top is conducting and connected to the sensor plate electrically. There would be mechanical and electrical considerations to be sure that such a handle does not interfere with normal operation of the socket (for example, opening and closing the lid) or add noise to the measurement.

The sensor extender plate can be made using an existing multi-layer PCB process where the bottom (outer) layer is a dielectric or isolating layer (no conductive material), acting as a protective layer to isolate the sensor plate from direct electrical contact with the socket pins. The sensor plate is an inner layer with plated through holes connecting it to solder pads on the top for connection to the handle.

Figure 12:
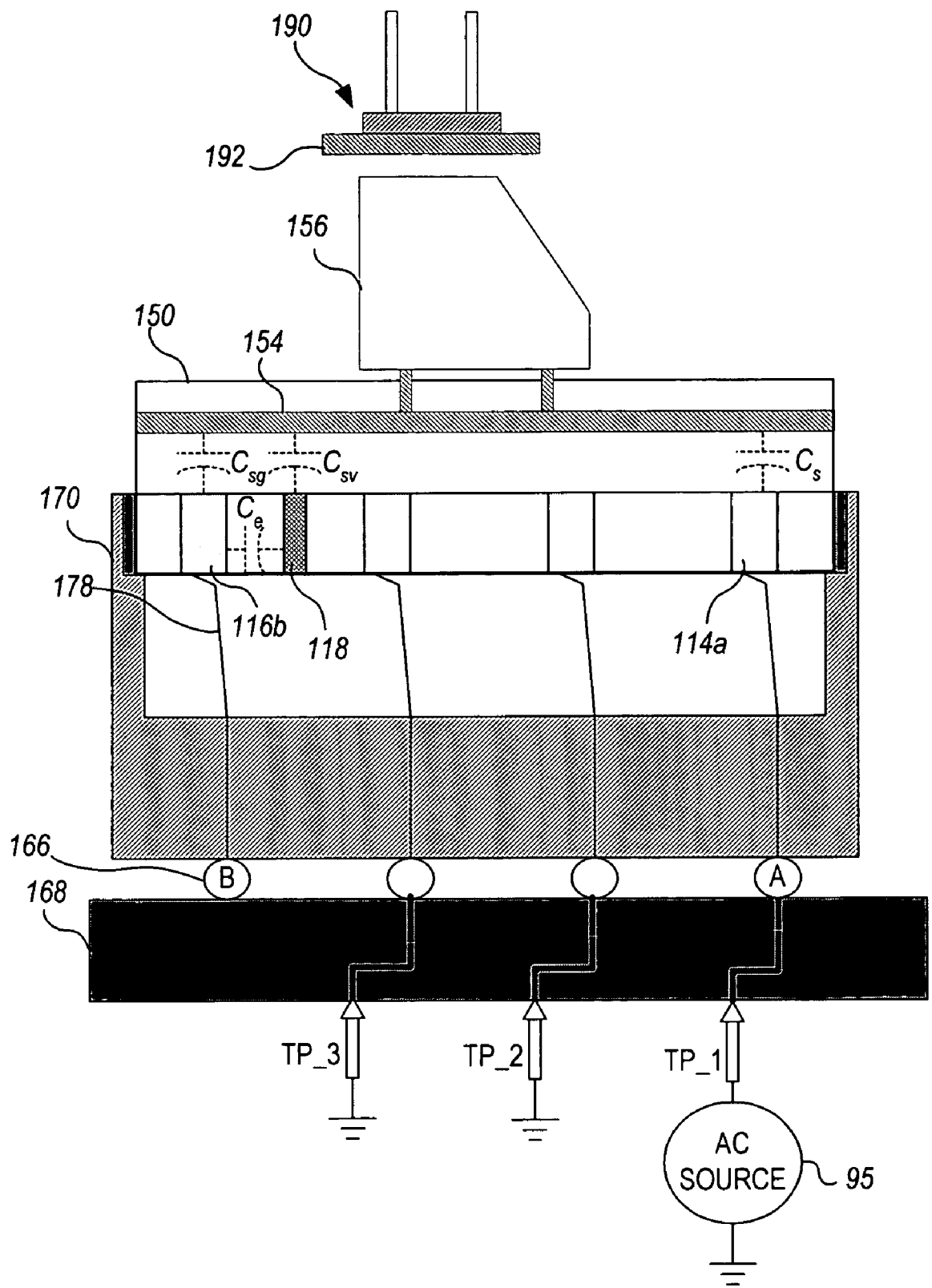
FIG. 12 is a side, cut-away view of an interposer with sensor extender handle that includes a multi-layer PCB with engineered capacitances mated with a socket.

Combining these ideas with the interposer concept of the invention allows for higher precision and better control of the capacitance values through the use of capacitors formed by the layout in different layers. For example, FIG. 12 illustrates an interposer 150 with sensor extender handle 156 that includes a multi-layer PCB with engineered capacitances (shown for the layout design of FIGS. 8A and 8B) that includes a conductive plane 154 which operates as a sense plate and a handle 156 electrically connected to the conductive plane 154. The handle 156 allows ease of handling the interposer 150 that also operates as an extension of the capacitive sense plane 154 embedded within the interposer 150. A standard capacitive sensing probe 190 may be used to capacitively couple with the sensor extension handle 156 to take capacitive coupling measurements in accordance with known capacitive sensing techniques.

Figure 13:
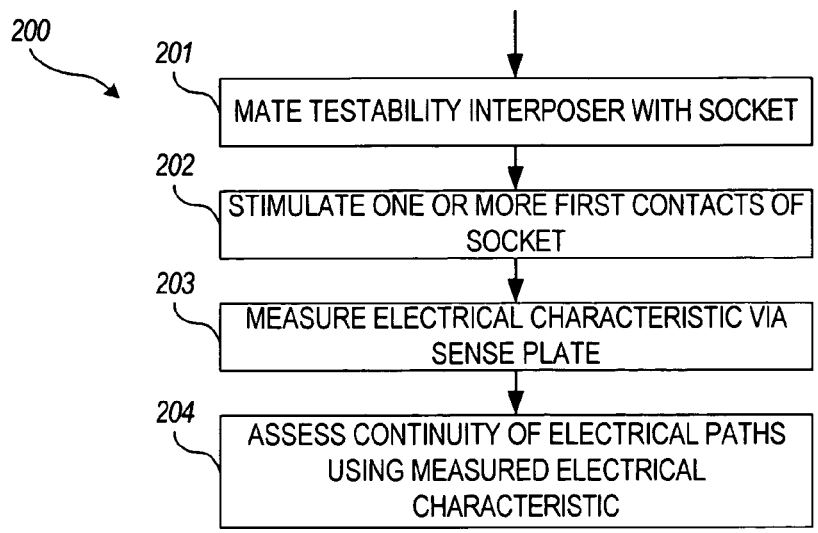
FIG. 13 is a flowchart illustrating an exemplary method for testing continuity of electrical paths through a testability interposer inserted in a socket connector of a circuit assembly.

FIG. 13 shows a flowchart illustrating an exemplary method 200 for testing continuity of electrical paths through an integrated circuit socket using the interposer of the invention. The socket includes at least a first set of socket electrical contacts and a second set of socket electrical contacts positioned such that the first set of socket electrical contacts have insufficient capacitive coupling to the second set of socket electrical contacts to allow accurate measurement by a capacitive sensing probe when the integrated circuit socket is empty. As illustrated, the method for testing includes: mating a testability interposer with the integrated circuit socket (step 201). Because each testability interposer is unique to the socket pin-out, PCB layout, and the tester's ability to probe the nodes of the socket, the testability interposer is configured to includes at least a first set of interposer electrical contacts configured to mate with the first set of socket electrical contacts when the interposer is mated with the integrated circuit socket and a second set of interposer electrical contacts that mate with the second set of socket electrical contacts when the interposer is mated with the integrated circuit socket. The testability interposer is configured with conductive material routed between one or more of the first set of interposer electrical contacts and one or more of the second set of interposer electrical contacts to capacitively couple the one or more of the first set of interposer electrical contacts and the one or more of the second set of interposer electrical contacts.

When the testability interposer is inserted within the integrated circuit socket with the interposer contacts mated with their corresponding respective socket contacts, one or more of the first set of socket electrical contacts of the socket (i.e., contacts in the socket that are supposed to be connected to signal nodes on the PCB and that are accessible for probing by the tester) are stimulated with a known alternating-current (AC) signal 195 (step 202). A capacitive sense plate 192 of a capacitive sensing probe 190 is brought into close proximity to both the first set of interposer electrical contacts and the second set of interposer electrical contacts of the interposer. An electrical characteristic such as capacitance or current is measured which represents the amount of capacitive coupling between the sense plate and the interposer contacts (step 203). The measured electrical characteristic is compared to at least one test threshold to assess continuities of electrical paths connected through the socket through the second set of socket electrical contacts using the capacitive sensing theory described herein and in the U.S. Patent Applications incorporated herein by reference (step 204).

Figure 14:
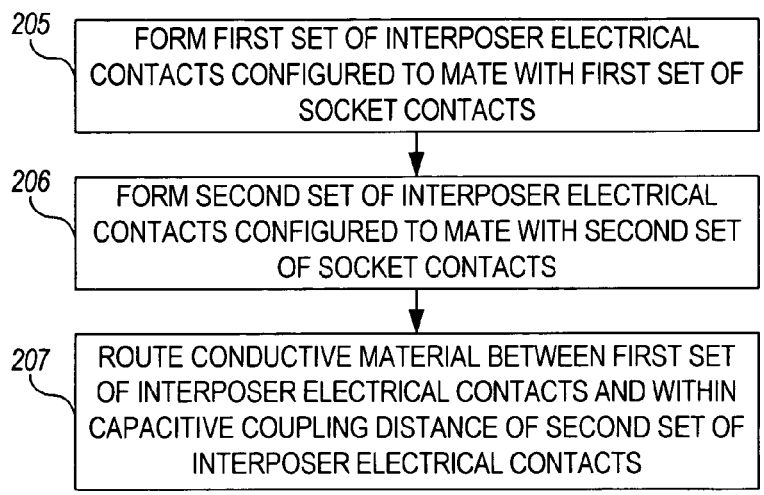
FIG. 14 is a flowchart of an exemplary method of manufacturing a testability interposer in accordance with the invention.

FIG. 14 is a flowchart of an exemplary method of manufacturing a testability interposer in accordance with the invention. The method of manufacturing the interposer includes forming a first set of interposer electrical contacts configured to mate with the first set of socket electrical contacts when the interposer is mated with the integrated circuit socket (step 205), forming a second set of interposer electrical contacts that mate with the second set of socket electrical contacts when the interposer is mated with the integrated circuit socket (step 206), and routing conductive material between one or more of the first set of interposer electrical contacts and one or more of the second set of interposer electrical contacts to capacitively couple the one or more of the first set of interposer electrical contacts and the one or more of the second set of interposer electrical contacts (step 207).

Figure 15:
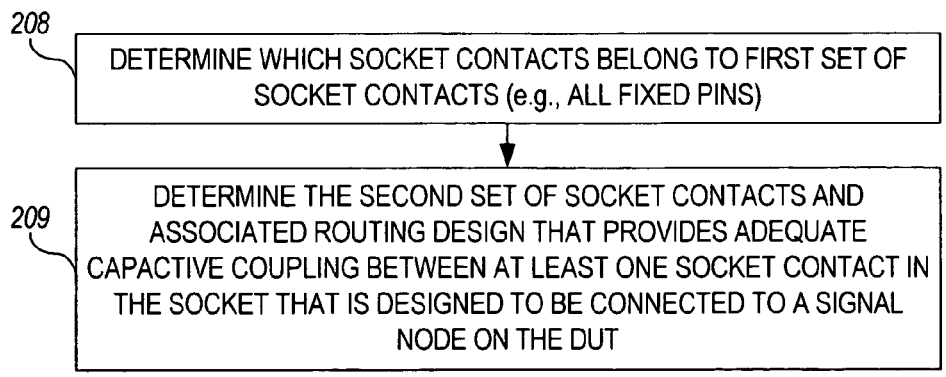
FIG. 15 is a flowchart of an exemplary method of designing a testability interposer in accordance with the invention.

As described above, a testability interposer is unique to the socket pin-out, PCB layout, and the tester's ability to probe the nodes of the socket. Accordingly, it will further be appreciated that the manufacturing of the interposer will require design, for example the method of FIG. 15, which includes the steps of determining which socket contacts belong to the first set of socket contacts (step 208), and determining the second set of socket contacts and associated routing design that provides adequate capacitive coupling between at least one socket contact in the socket that is designed to be connected to a signal node on the DUT (step 209). For example, the first step 208 may be determining the first set of socket contacts to be all of the socket contacts that by design are to connect to fixed and tied nodes on the PCB. The second step 209 may be selecting certain socket contacts that are to be connected by design to signal nodes on the PCB and which, in conjunction with an associated routing design, provide adequate capacitive coupling to as many as possible of the socket contacts in the selected first set of socket contacts to ensure adequate capacitive coupling amplitudes, adequate coupling redundancy, and adequate diagnostic resolution between the first set of socket contacts and the second set of socket contacts when the interposer is seated in the socket.

The interposer will generally be formed using standard PCB manufacturing techniques and the finished product will generally be an integrated circuit configured to mate with an integrated circuit socket or a PCB configured to mate with a PCB connector.

It will be appreciated from the above discussion that the use of a testability interposer in the testing of socket and connectors of circuit assemblies affords many advantages over the prior art. To summarize, because the interposer is formed with purposely engineered capacitances between interposer contacts, the interposer allows test coverage for socket connections to fixed and inaccessible nodes that have been previously untestable due to lack of coupling to an accessible signal node by the tester. The known and expected capacitance relationships between the contact nodes of the interposer allows the application of capacitive sensing techniques to detect open and short defects. Because the interposer mates directly into the socket, thereby giving an ohmic contact to the socket contacts (i.e., pins), the test coverage of the interposer also extends to detection of mechanical integrity defects such as bent pins. Furthermore, if sufficient redundant coupling between multiple signal pins and multiple fixed pins is designed into the interposer, the interposer can provide excellent diagnostic resolution of faults. Additionally, the design of the interposer is less expensive than that of a silicon chip solution because the PCB capacitances can be easily modeled, and PCB manufacturing/tooling costs are relatively lower compared to a silicon chip design. Like a silicon chip solution, each socket interposer will be unique to the socket and pin layout of the PCB on which the socket is soldered. However, the interposer solution is faster, simpler, and less expensive to modify when design changes are made to the socket or pin functionality layout. The interposer enables vectorless based testing which is advantageous compared to the silicon chip based socket solution because vectorless testing is an unpowered test technique and does not require extensive test expertise to create vectors. Finally, the interposer design may be sufficiently cost-effective to allow replacement of the shipping slug, combining the benefits of both. An integrated handle will reduce the potential for damage to socket contacts during insertion and extraction of the test chip and provide convenient capacitive coupling to an external sensor plate and amplifier. The amplifier could also be integrated into the handle. The interposer design could also be combined with the traditional capacitive sense plate when socket insertion is not a manufacturing option. The new plate would have pad contacts on the bottom and the engineered capacitances like the interposer but would also mate directly to the necessary fixture electronics needed for capacitive sense testing.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A device for testing continuity of electrical paths through an integrated circuit socket of a circuit assembly, the integrated circuit socket comprising a first set of socket electrical contacts and a second set of socket electrical contacts positioned such that the first set of socket electrical contacts would have insufficient capacitive coupling to the second set of socket electrical contacts to allow accurate measurement by a capacitive sensing probe when stimulated by a known test signal, the device comprising:
    a first set of interposer electrical contacts configured to mate with the first set of socket electrical contacts when the interposer is mated with the integrated circuit socket;
    a second set of interposer electrical contacts configured to mate with the second set of socket electrical contacts when the interposer is mated with the integrated circuit socket; and
    conductive material routed to capacitively couple one or more of the first set of interposer electrical contacts to one or more of the second set of interposer electrical contacts, the conductive material providing, between the one or more of the first set of interposer electrical contacts and the one or more of the second set of interposer electrical contacts, one or more known capacitances that are detectable by the capacitive sensing probe.

2. The device of claim 1, further comprising:
    a sense plate capacitively coupled to the first set of interposer electrical contacts and the second set of interposer electrical contacts.

3. The device of claim 2, wherein:
    the sense plate is configured to capacitively couple with a capacitive sense plate of a tester.

4. The device of claim 2, further comprising:
    a handle that is configured to capacitively couple with a capacitive sense plate of a tester.

5. The device of claim 1, wherein the conductive material comprises one or more conductive traces.

6. The device of claim 5, wherein the conductive material further comprises one or more vias.

7. The device of claim 1, wherein the conductive material comprises one or more vias.

8. An apparatus for testing continuity of electrical paths through an integrated circuit socket of a circuit assembly, the integrated circuit socket comprising a first set of socket electrical contacts and a second set of socket electrical contacts positioned such that the first set of socket electrical contacts would have insufficient capacitive coupling to the second set of socket electrical contacts to allow accurate measurement by a capacitive sensing probe when stimulated by a known test signal, the apparatus comprising:
    an interposer inserted in the integrated circuit socket, the interposer comprising:
        a first set of interposer electrical contacts configured to mate with the first set of socket electrical contacts when the interposer is mated with the integrated circuit socket;
        a second set of interposer electrical contacts that mate with the second set of socket electrical contacts when the interposer is mated with the integrated circuit socket; and
    conductive material routed to capacitively couple one or more of the first set of interposer electrical contacts to one or more of the second set of interposer electrical contacts;
    a capacitive sense plate configured to capacitively couple with first set of interposer electrical contacts and the second set of interposer electrical contacts;
    a tester configured to stimulate nodes on the circuit assembly coupled to the electrical paths through the integrated circuit socket of the circuit assembly and measure electrical characteristics of the integrated circuit socket sensed by the capacitive sense plate.

9. An apparatus in accordance with claim 8, wherein the tester is further configured to compare the measured electrical characteristic to at least one threshold to assess continuities of electrical paths through the integrated circuit socket of a circuit assembly.

10. The device of claim 9, further comprising:
    a handle that is configured to capacitively couple with a capacitive sense plate of a tester.

11. The device of claim 8, further comprising:
    a handle that is configured to capacitively couple with a capacitive sense plate of a tester.

12. A method for testing continuity of electrical paths through an integrated circuit socket while a testablility interposer is within the integrated circuit socket, the socket comprising a first set of socket electrical contacts and a second set of socket electrical contacts positioned such that the first set of socket electrical contacts have insufficient capacitive coupling to the second set of socket electrical contacts to allow accurate measurement by a capacitive sensing probe when the interposer is not inserted within the integrated circuit socket, the interposer comprising a first set of interposer electrical contacts configured to mate with the first set of socket electrical contacts when the interposer is mated with the integrated circuit socket, a second set of interposer electrical contacts that mate with the second set of socket electrical contacts when the interposer is mated with the integrated circuit socket, and conductive material routed between one or more of the first set of interposer electrical contacts and one or more of the second set of interposer electrical contacts to capacitively couple the one or more of the first set of interposer electrical contacts and the one or more of the second set of interposer electrical contacts, the method comprising:

stimulating one or more of the first set of socket electrical contacts of the socket;

capacitively coupling the first set of interposer electrical contacts and a second set of interposer electrical contacts to a capacitive sense plate;

measuring an electrical characteristic; and comparing the measured electrical characteristic to at least one threshold to assess continuities of electrical paths connected through the socket through the second set of socket electrical contacts.

13. A method for testing continuity of electrical paths through an integrated circuit socket, the socket comprising a first set of socket electrical contacts and a second set of socket electrical contacts positioned such that the first set of socket electrical contacts have insufficient capacitive coupling to the second set of socket electrical contacts to allow accurate measurement by a capacitive sensing probe when the integrated circuit socket is empty, the method comprising:

mating a testability interposer with the integrated circuit socket, the testability interposer comprising a first set of interposer electrical contacts configured to mate with the first set of socket electrical contacts when the interposer is mated with the integrated circuit socket, a second set of interposer electrical contacts that mate with the second set of socket electrical contacts when the interposer is mated with the integrated circuit socket, and conductive material routed between one or more of the first set of interposer electrical contacts and one or more of the second set of interposer electrical contacts to capacitively couple the one or more of the first set of interposer electrical contacts and the one or more of the second set of interposer electrical contacts;

stimulating one or more of the first set of socket electrical contacts of the socket;

capacitively coupling the first set of interposer electrical contacts and a second set of interposer electrical contacts to a capacitive sense plate;

measuring an electrical characteristic; and comparing the measured electrical characteristic to at least one threshold to assess continuities of electrical paths connected through the socket through the second set of socket electrical contacts.

* * * * *